United States Patent
Hotta et al.

(10) Patent No.: US 8,450,142 B2
(45) Date of Patent: May 28, 2013

(54) ORGANIC THIN FILM TRANSISTORS

(75) Inventors: Sadayoshi Hotta, Osaka (JP); Jeremy Henley Burroughes, Cambridge (GB); Gregory Lewis Whiting, Menlo Park, CA (US)

(73) Assignees: Cambridge Display Technology Limited, Cambridgeshire (GB); Panasonic Corporation, Kadoma-Shi, Osaka (JP)

( * ) Notice: Subject to any disclaimer, the term of this patent is extended or adjusted under 35 U.S.C. 154(b) by 786 days.

(21) Appl. No.: 12/532,629

(22) PCT Filed: Apr. 3, 2008

(86) PCT No.: PCT/EP2008/054040
§ 371 (c)(1),
(2), (4) Date: Sep. 22, 2009

(87) PCT Pub. No.: WO2008/122575
PCT Pub. Date: Oct. 16, 2008

(65) Prior Publication Data
US 2010/0051922 A1 Mar. 4, 2010

(30) Foreign Application Priority Data
Apr. 4, 2007 (GB) .................................. 0706652.5

(51) Int. Cl.
H01L 51/10 (2006.01)
H01L 51/40 (2006.01)
H01L 21/336 (2006.01)
H01L 29/786 (2006.01)

(52) U.S. Cl.
USPC .............. 438/99; 257/E51.006; 257/E29.273; 257/E21.411; 438/151

(58) Field of Classification Search
USPC .................... 257/40, 347, E51.006, E29.273, 257/E21.411; 438/99, 151
See application file for complete search history.

(56) References Cited

U.S. PATENT DOCUMENTS 6,300,988 B1 * 10/2001 Ishihara et al. .................. 349/43
6,635,508 B2 * 10/2003 Arai et al. ........................ 438/99
7,288,818 B2 * 10/2007 Lee et al. ....................... 257/347

(Continued)

FOREIGN PATENT DOCUMENTS
CN 1905233 A 1/2007
EP 1263062 A2 12/2002

(Continued)

OTHER PUBLICATIONS

Iba et al., "Control of threshold voltage of organic field-effect transistors with double-gate structures," *Applied Physics Letters, AIP, Am. In. Phys.*, 87:23509-1-023509-3 (2005).

(Continued)

Primary Examiner — Long Tran
Assistant Examiner — Jordan Klein
(74) Attorney, Agent, or Firm — Marshall, Gerstein & Borun LLP

(57) ABSTRACT

An organic thin film transistor comprising: a substrate; a source electrode and a drain electrode defining a channel; a layer of insulating material disposed over the source and drain electrodes; a layer of organic semi-conductive material extending across the channel; a layer of dielectric material; and a gate electrode disposed over the layer of dielectric material.

16 Claims, 6 Drawing Sheets

U.S. PATENT DOCUMENTS

| | | | |
|---|---|---|---|
| 7,919,365 B2* | 4/2011 | Kim et al. | 438/149 |
| 2002/0179901 A1* | 12/2002 | Arai et al. | 257/40 |
| 2006/0060855 A1* | 3/2006 | Lee et al. | 257/59 |
| 2006/0220022 A1* | 10/2006 | Moriya | 257/60 |
| 2007/0023837 A1* | 2/2007 | Lee et al. | 257/347 |
| 2007/0252207 A1* | 11/2007 | Park et al. | 257/347 |
| 2008/0128685 A1 | 6/2008 | Honda et al. | |

FOREIGN PATENT DOCUMENTS

| | | |
|---|---|---|
| JP | 2004-055649 A | 2/2004 |
| JP | 2005-108949 | 4/2005 |
| JP | 2007-036259 A | 2/2007 |
| JP | 2008109116 A | 5/2008 |

OTHER PUBLICATIONS

International Search Resort and Written Opinion for PCT/EP2008/054040 dated Jul. 15, 2008.

British Search and Examination Resort for GB 0706652.5 dated May 15, 2009.

Office Action for corresponding Chinese Application No. 20088001563.1, dated Oct. 27, 2011.

Partial English translation of Office Action for corresponding Japanese Patent Application No. 2010-501516, dated Feb. 19, 2013.

* cited by examiner

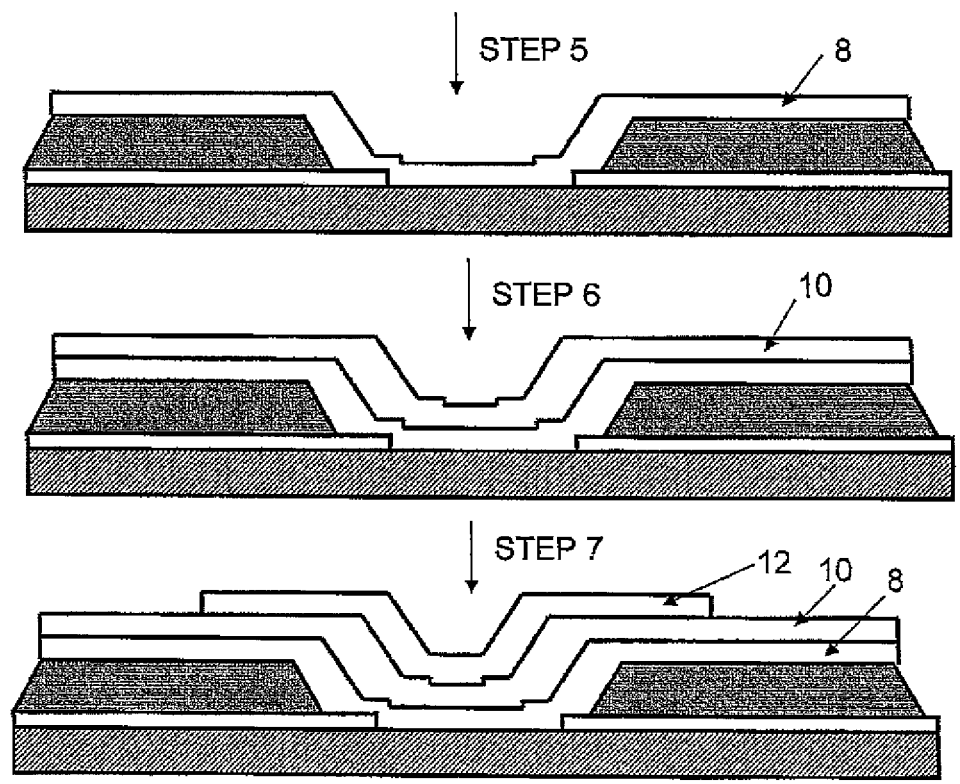

ORGANIC THIN FILM TRANSISTORS

FIELD OF INVENTION

The present invention relates to organic thin film transistors.

BACKGROUND OF THE INVENTION

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and injecting holes or electrodes. For example, a p-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO level of the semi-conductive material can enhance hole injection and acceptance. In contrast, an n-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO level of the semi-conductive material can enhance electron injection and acceptance.

Transistors can be formed by depositing the components in thin films to form thin film transistors. When an organic material is used as the semi-conductive material in such a device, it is known as an organic thin film transistor (OTFT). OTFTs may be manufactured by low cost, low temperature methods such as solution processing. Moreover, OTFTs are compatible with flexible plastic substrates, offering the prospect of large-scale manufacture of OTFTs on flexible substrates in a roll-to-roll process.

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulating material disposed between the gate electrode and the semi-conductive material in the channel region.

An example of such an organic thin film transistor is shown in FIG. 1. The illustrated structure may be deposited on a substrate (not shown) and comprises source and drain electrodes 2, 4 which are spaced apart with a channel region 6 located therebetween. An organic semiconductor (OSC) 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

One problem with organic thin film transistors is parasitic gate capacitance and gate leakage to the source and drain. In prior art arrangements, such as that illustrated in FIG. 1, this problem may be solved by increasing the thickness of gate insulating material. However, if the thickness of the gate insulating material is increased adjacent the channel region, then a larger voltage will be required to turn on the transistor. Accordingly, a preferred solution would be to only increase the thickness of the gate insulating material in the gate and source/drain overlap area. Such a solution is known from the documents discussed below.

US 2006/060855 discloses an extra insulating layer only in the region where the gate and the source/drain electrodes overlap. This extra insulating layer is deposited over the main gate dielectric layer and patterned prior to deposition of the gate.

US 2006/220022 discloses a gate insulating layer having varying thickness. The gate insulating layer is thinner in a central region thereof over the channel and is thicker at peripheral regions where the gate overlaps the source/drain.

One possible problem with both the aforementioned arrangements is that they require extra dielectric material to be deposited over the organic semi-conductive layer which may damage the organic semi-conductive layer. Another possible problem with both the aforementioned arrangements is that it is difficult to align all the overlying layers in the device, such as alignment of the gate with the channel region between the source and drain. Furthermore, containment of the organic semi-conductive material in the channel region may also be a problem.

An additional problem with the arrangement disclosed in US 2006/060855 is that it requires deposition of an additional layer of dielectric material over the gate dielectric layer and patterning of the additional layer by, for example, etching. This may cause damage to the underlying gate dielectric layer in the channel region affecting the performance of the transistor.

An additional problem with the arrangement disclosed in US 2006/220022 is that the gate dielectric layer of varying thickness may be difficult to form in a reproducible manner in order to form devices having uniform properties.

It is one aim of embodiments of the present invention to provide a solution to one or more of the problems discussed above.

SUMMARY OF INVENTION

According to a first aspect of the present invention, there is provided an organic thin film transistor comprising: a substrate; a source electrode and a drain electrode defining a channel; a layer of insulating material disposed over the source and drain electrodes; a layer of organic semi-conductive material extending across the channel; a layer of dielectric material; and a gate electrode disposed over the layer of dielectric material.

It will understood by the skilled person that the layer of organic semi-conductive material serves to provide a path for charge carriers to flow across the channel, and so this layer may be provided underneath or on top of the source and drain electrodes. Thus, layer of organic semi-conductive material may be provided between the substrate and the source and drain electrodes (i.e. the organic semi-conductive material is deposited before deposition of the source and drain electrodes). However, it is preferred that the organic semi-conductive material is deposited after formation the layer of insulating layer.

The insulating layer may be deposited over some or over substantially all of the area of the source and drain electrodes.

Embodiments of the present invention provide an insulating layer which isolates the peripheral areas of the gate from the source and drain so as to minimise capacitance and gate leakage to the source and drain. The insulating layer also serves to form a well in which the other layers of the organic thin film transistor can be deposited to enhance alignment. In particular, the periphery of the well surrounds some or all of the channel defined between the source and drain electrodes in order to facilitate deposition of the organic semiconductive material, for example by inkjet printing. Furthermore, as the insulating layer is deposited prior to deposition of the organic semi-conductive layer and the gate dielectric, it may be deposited and patterned without damaging the organic semiconductive layer and the gate dielectric. The structure can be formed in a reproducible manner using known deposition and patterning techniques (photolithography of positive or negative resists, wet etching, dry etching, etc.) to produce devices having uniform properties with low capacitance and gate leakage to the source and drain.

According to a second aspect of the present invention there is provided a method of forming an organic thin film transistor comprising: depositing source and drain material on a substrate; forming a layer of insulating material over the source and drain, the insulating material being patterned to form a well; etching the source and drain material in the well to form source and drain electrodes; depositing organic semiconductive material in the well; depositing a dielectric material over the organic semiconductive material; and depositing a gate electrode over the dielectric material.

The insulating material may be directly deposited in patterned form, for example by evaporation of an evaporable insulating material through a mask. However, it is preferable that the layer of insulating material is deposited in an unpatterned form and subsequently patterned, for example by spin-coating and developing a layer of photoresist.

According to this aspect of the present invention, the insulating layer acts as an etch mask for metal etching to form the source and drain electrodes. The insulating layer also acts as a well for deposition of the other layers of the organic thin film transistor. As such, the method provides self-alignment of the source and drain with the overlying layers. In this aspect of the invention, the patterned layer of insulating material is preferably formed by exposing an upper surface of a layer of photoresist to UV light.

According to a third aspect of the present invention there is provided a method of forming an organic thin film transistor comprising: forming source and drain electrodes on a transparent substrate; forming a layer of insulating material over the source and drain, the insulating material being patterned to form a well; depositing organic semiconductive material in the well; depositing a dielectric material over the organic semiconductive material; and depositing a gate electrode over the dielectric material.

According to this aspect of the invention, the source and drain electrodes are patterned prior to formation of the patterned layer of insulating material.

The insulating material may be directly deposited in patterned form, for example by evaporation of an evaporable insulating material through a mask. However, it is preferred that the patterned layer of insulating material is formed by depositing a a layer of photoresist over the source and drain electrodes and exposing the photoresist through the transparent substrate. In this way, the source and drain electrodes serve as a self-aligned shadow mask for patterning of the layer of photoresist.

The self-aligning process of the second or third aspects of the invention minimises process steps and results in a thick insulating layer between the source/drain and the gate in overlapping regions away from the channel region. This solution also allows the physical width of the gate to be enlarged (i.e. so that it can be printed) without undue increase in capacitance and current leakage. Thus, embodiments of the present invention provide a simple process by which the source and drain electrodes can be aligned with the remaining layers of the thin film transistor while reducing capacitance and gate leakage. Furthermore, the gate can be printed or deposited using other simple patterning techniques.

According to a fourth aspect of the invention there is provided an organic thin film transistor comprising: a substrate; a gate electrode over the substrate; a layer of dielectric material over the gate electrode; a source electrode and a drain electrode over the layer of dielectric material and defining a channel; a layer of organic semi-conductive material extending across the channel; and a layer of insulating material disposed between the source and drain electrodes and the layer of dielectric material.

The bottom-gate arrangement of the fourth aspect of the invention may serve to minimise parasitic capacitance in the same way as the corresponding top-gate arrangement of the first aspect of the invention.

In one embodiment of the fourth aspect of the invention, the thickness of the layer of insulating material is greater in the area beneath the source and drain electrodes than the area beneath the channel region. In another embodiment of the fourth aspect of the invention, the insulating material is absent from the area beneath the channel region.

According to a fifth aspect of the invention there is provided a method of forming an organic thin film transistor comprising source and drain electrodes defining a channel between said electrodes; a gate electrode; a layer of dielectric material between the gate electrode and the source and drain electrodes; and a layer of organic semiconductive material located in the channel, wherein the organic semiconductive material is printed into a well defined in a layer of an insulating material.

Preferably, the organic semiconductive material is printed by inkjet printing.

The thin-film transistor according to this fifth aspect may be a top-gate or bottom-gate device. If it is a top-gate device, the insulating material is preferably as described with respect to the first aspect of the invention. If it is a bottom-gate device, the insulating material may be the layer of gate dielectric material, wherein the dielectric material has been etched or otherwise patterned to define a well extending to part of the thickness of the gate dielectric layer in the area where it overlies the gate electrode. An OTFT having this structure is disclosed in JP 2005-108949, although in this case the organic semiconductor is deposited by evaporation, rather than by a printing process according to this aspect of the invention. Alternatively, the insulating layer may be formed from a layer of photoresist that is deposited over the gate dielectric and patterned to define such wells.

BRIEF DESCRIPTION OF THE DRAWINGS

The present invention will now be described in further detail, by way of example only, with reference to the accompanying drawings in which.

DETAILED DESCRIPTION OF THE PREFERRED EMBODIMENTS

Figure 2:
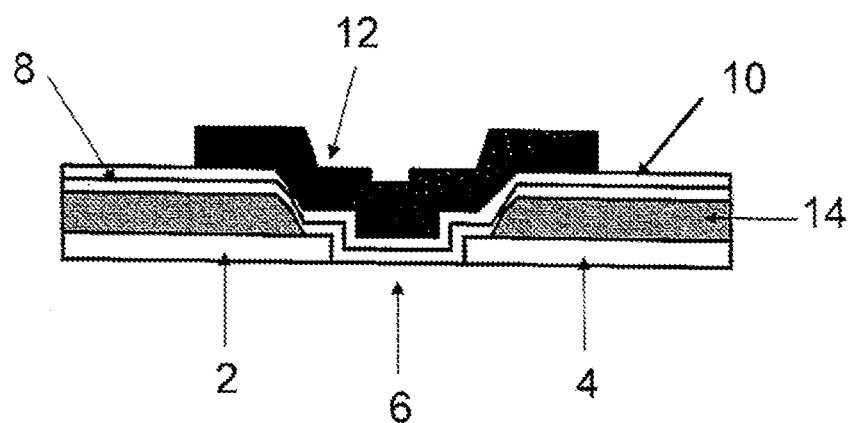
FIG. 2 shows a top-gate organic thin film transistor structure according to an embodiment of the present invention.

FIG. 2 shows a top-gate organic thin film transistor structure according to an embodiment of the present invention. The transistor is of the insulated gate field-effect type.

Figure 1:
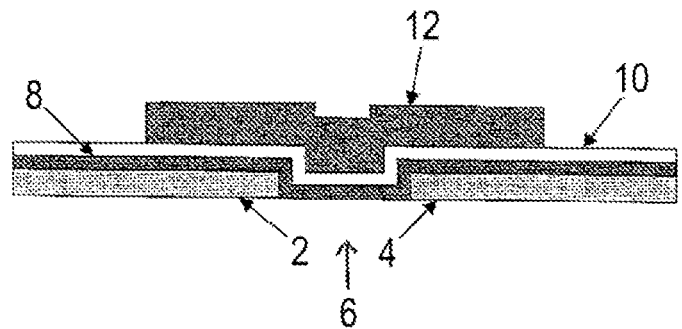
FIG. 1 shows a basic organic thin film transistor structure according to a prior art arrangement.

The transistor has a similar structure to that illustrated in FIG. 1 and previously described in the background section. For reasons of clarity, the same reference numerals have been used as in FIG. 1 for common layers. The important difference is that in the arrangement illustrated in FIG. 2, a layer of insulating material 14 is disposed over the source and drain 2, 4 forming a well. This layer isolates the peripheral areas of the overlying gate electrode 12 from the source and drain 2, 4 so as to minimise capacitance and gate leakage to the source and drain. The insulation layer 14 also serves to form a well in which the other layers of the organic thin film transistor can be deposited to enhance alignment.

Figure 3A:
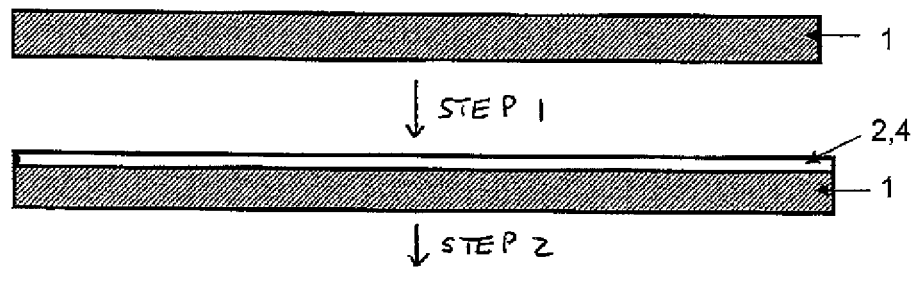
FIG. 3a illustrates steps involved in a method of the invention for forming the organic thin film transistor shown in FIG. 2.

FIG. 3a illustrates the method steps involved in forming the organic thin film transistor shown in FIG. 2. In step 1, source/drain material 2, 4 is deposited on a substrate 1 (which may be opaque or transparent). In step 2, a layer of insulating material 14 is deposited over the source/drain material 1, 4.

In step 3, the layer of insulating material 14 is patterned to form a well. The insulating layer 14 can be formed of any insulating material which can be deposited and patterned to form a well without damaging the underlying source/drain material 2, 4. The insulating layer 14 may be an organic photoresist such as a polyimide which can be readily spin coated and patterned. The insulating material may be treated with a fluorination step to alter its wettability. Alternatively, a fluorinated or fluorinated-like photoresist may be employed. The formation of wells (bank structures) using such materials is well known in the art of organic light-emissive devices and will not be discussed in more detail here.

In step 4, the source and drain material is etched to form source and drain electrodes 2, 4. Various standard metal etches may be used, wet or dry. These are known in the art and will not be discussed in more detail here. The insulating layer 14 acts as an etch mask for the source/drain metal etch. As such, the method provides self-alignment of the source and drain with the overlying layers. After the metal etch, the insulating layer may be exposed to an isotropic etch to thin the insulating layer and also remove insulating layer material from the source/drain edge in the well as illustrated. A suitable isotropic etch can be, for example, $CF_4$:$O_2$, $O_2$ plasma, or the like.

In step 5, organic semi-conductive material 8 is deposited. Preferably, the organic semi-conductive material 8 is solution processable such that it can be deposited from solution by, for example, spin-coating or, more preferably, ink-jet printing into the wells formed by the insulating layer 14. The organic semi-conductive material 8 may comprise a polymer or dendrimer as these have proved to be good solution processable materials. Many such semi-conductive materials are known in the art, for example, conjugated polymers and dendrimers utilized in organic light-emissive devices.

In step 6, a dielectric layer 10 is deposited over the semi-conductive layer. The dielectric layer may be formed of an organic or inorganic material. One possibility would be to use a solution processable organic material, for example, of the same type used for the insulating layer 14.

Finally, in step 7, a gate electrode 12 is deposited over the dielectric layer 10. The gate 12 can be printed or deposited using other simple patterning techniques which are known in the art.

The insulating layer 14 may be utilised to reduce track leakage between lower and higher level metallization in a device such as a display (e.g. an active matrix organic light-emissive display). A resist step may be utilised to protect contact via points when performing the metal etch step in such a device to protect the contact via points during the metal etch.

Figure 3B:
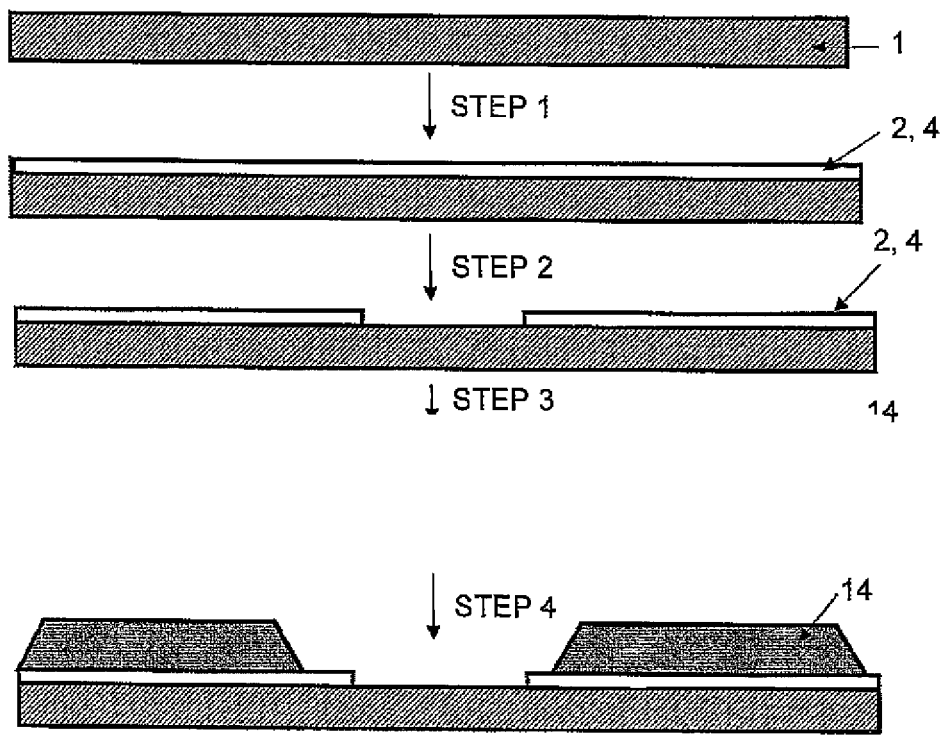
FIG. 3b illustrates steps involved in another method of the invention for forming the organic thin film transistor shown in FIG. 2.

FIG. 3b illustrates the method steps involved in forming the organic thin film transistor shown in FIG. 2 in an alternative method to that of FIG. 3a.

In this case, the source and drain material is etched to form source and drain electrodes 2, 4 as shown in step 2. In step 3, a layer of insulating positive photoresist material 14 is deposited over the patterned source and drain electrodes, and in step 4 the photoresist is pattered by exposure through transparent substrate 1. The source and drain electrodes 2, 4 serve as self-aligned masks for patterning of the photoresist to leave patterned layer 14 after development of the resist.

Figure 4:
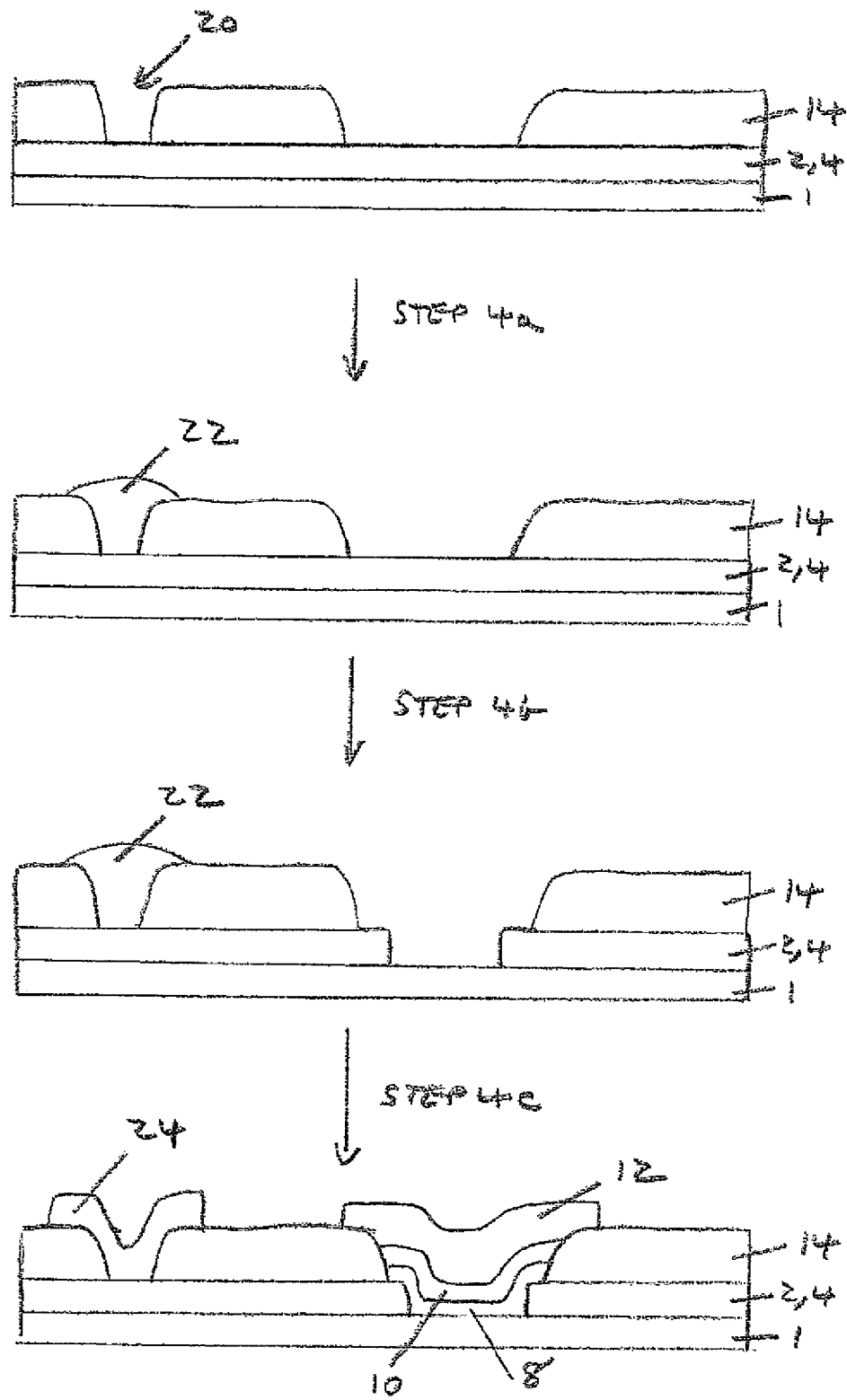
FIG. 4 illustrates additional method steps involved in protecting via contact points.

FIG. 4 illustrates additional method steps involved in protecting via contact points. In step 4a a resist 22 is deposited in a via 20 prior to etching of the source/drain material 2, 4 in step 4b. The remaining layers of the transistor can then be deposited in step 4c as described previously with reference to FIG. 3. Contact material 24 is deposited in the via 20 to form a contact via point.

Figure 5:
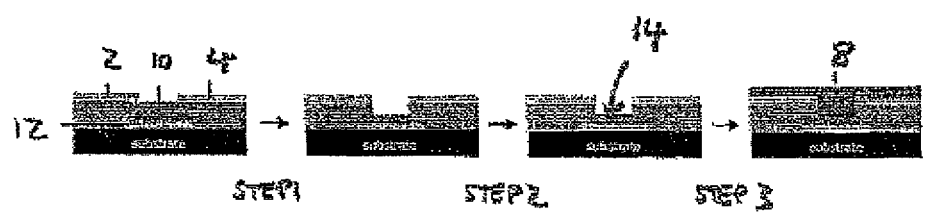
FIG. 5 shows a bottom-gate organic thin film transistor structure according to an embodiment of the present invention.
Figure 6:
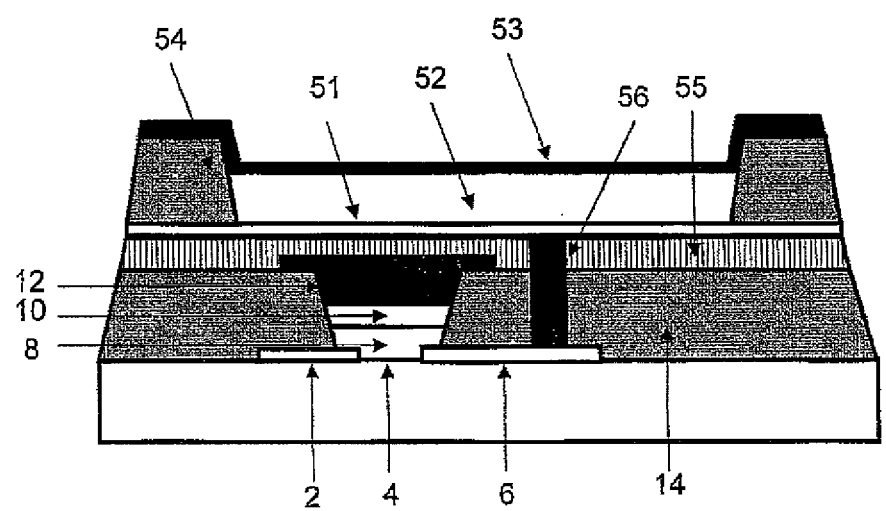
FIG. 6 illustrates a cross-section of a pixel of an active matrix organic light-emitting device (OLED), comprising an organic light-emitting diode pixel and an OTFT.

FIG. 5 illustrates formation of a well in the dielectric layer of a bottom-gate device into which the organic semiconducting material may be printed. In this case, the substrate is initially prepared by formation of a gate electrode 12, a thick dielectric layer 10 (~1-5 μm), which could be made of polymer or inorganic materials such as $SiO_2$. Source and drain contacts 2, 4 are then deposited (this is a bottom gate, bottom contact transistor architecture).

The dielectric layer 10 is then etched back in a controlled way in Step 1, with the source-drain contacts 2, 4 acting as a self-aligned mask for the etch. This can be carried out with either a dry or wet etching technique, as long as the etching can be controlled so that it does not completely etch through the dielectric layer.

As the physical and chemical properties of the dielectric interface in the channel region can be important for device operation, in an optional step, any damage to the dielectric surface caused by the etching step may be repaired by, for example, deposition of a self-assembled monolayer 14 onto the exposed dielectric surface.

The organic thin film transistor is then completed by deposition of the organic semi-conductive layer 8 as illustrated in Step 3 by printing, preferably by inkjet printing.

The OTFT of FIG. 5 comprises a thin region of dielectric material disposed in the channel region while thick regions of dielectric material are provided under the source and drain. These thick regions of dielectric material isolate the peripheral areas of the gate electrode from the source and drain so as to minimise parasitic capacitance and gate leakage to the source and drain. The thick regions of dielectric material also serve to form a well in which the organic semi-conductive material is deposited. If the well is made very deep, the conductive path length between the source and drain may be increased. This is because the charge carriers in the organic semi-conductor tend to be transported in a region of the channel close to the dielectric. Accordingly, the charge carriers may travel from the source down into the base of the well, across the channel region, and then back up to the drain. In this case, if a deep well is desired, in order to reduce the conductive path length between the source and drain, the sides of the well may be metallised.

Materials and processes suitable for forming the OTFT of the present invention are discussed in further detail below.

Substrate

The substrate may be rigid or flexible. Rigid substrates may be selected from glass or silicon and flexible substrates may comprise thin glass or plastics such as poly(ethylene terephthalate) (PET), poly(ethylene-naphthalate) PEN, polycarbonate and polyimide.

The organic semiconductive material may be made solution processable through the use of a suitable solvent. Exemplary solvents include mono- or poly-alkylbenzenes such as toluene and xylene; tetralin; and chloroform. Preferred solution deposition techniques include spin coating and ink jet printing. Other solution deposition techniques include dip-coating; roll printing; and screen printing. In cases where a solution is dispensed from a nozzle, the printing process may be either continuous or discontinuous. For example, in a continuous process a continuous strip of organic semiconductive material may be dispensed from a nozzle, whereas discontinuous drops are dispensed from a nozzle in a discontinuous printing process.

Organic Semiconductor Materials

Preferred organic semiconductor materials include small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

Source and Drain Electrodes

For a p-channel OTFT, preferably the source and drain electrodes comprise a high workfunction material, preferably a metal, with a workfunction of greater than 3.5 eV, for example gold, platinum, palladium, molybdenum, tungsten, or chromium. More preferably, the metal has a workfunction in the range of from 4.5 to 5.5 eV. Other suitable compounds, alloys and oxides such as molybdenum trioxide and indium tin oxide may also be used. The source and drain electrodes may be deposited by thermal evaporation and patterned using standard photolithography and lift off techniques as are known in the art.

Alternatively, conductive polymers may be deposited as the source and drain electrodes. An example of such a conductive polymers is poly(ethylene dioxythiophene) (PEDOT) although other conductive polymers are known in the art. Such conductive polymers may be deposited from solution using, for example, spin coating or ink jet printing techniques and other solution deposition techniques discussed above.

For an n-channel OTFT, preferably the source and drain electrodes comprise a material, for example a metal having a workfunction of less than 3.5 eV such as calcium or barium or a thin layer of metal compound, in particular an oxide or fluoride of an alkali or alkali earth metal for example lithium fluoride, barium fluoride and barium oxide. Alternatively, conductive polymers may be deposited as the source and drain electrodes.

The source and drain electrodes are preferably formed from the same material for ease of manufacture. However, it will be appreciated that the source and drain electrodes may be formed of different materials for optimisation of charge injection and extraction respectively.

The length of the channel defined between the source and drain electrodes may be up to 500 microns, but preferably the length is less than 200 microns, more preferably less than 100 microns, most preferably less than 20 microns.

Gate Electrode

The gate electrode 4 can be selected from a wide range of conducting materials for example a metal (e.g. gold) or metal compound (e.g. indium tin oxide). Alternatively, conductive polymers may be deposited as the gate electrode 4. Such conductive polymers may be deposited from solution using, for example, spin coating or ink jet printing techniques and other solution deposition techniques discussed above Thicknesses of the gate electrode, source and drain electrodes may be in the region of 5-200 nm, although typically 50 nm as measured by Atomic Force Microscopy (AFM), for example.

Insulating Layer

The insulating layer comprises a dielectric material selected from insulating materials having a high resistivity. The dielectric constant, k, of the dielectric is typically around 2-3 although materials with a high value of k are desirable because the capacitance that is achievable for an OTFT is directly proportional to k, and the drain current ID is directly proportional to the capacitance. Thus, in order to achieve high drain currents with low operational voltages, OTFTs with thin dielectric layers in the channel region are preferred.

The dielectric material may be organic or inorganic. Preferred inorganic materials include Sio2, SiNx and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, that is use of a solvent for deposition of the uppermost layer that does not dissolve the underlying layer; and crosslinking of the underlying layer.

The thickness of the insulating layer is preferably less than 2 micrometres, more preferably less than 500 nm.

Further Layers

Other layers may be included in the device architecture. For example, a self assembled monolayer (SAM) may be deposited on the gate, source or drain electrodes, substrate, insulating layer and organic semiconductor material to promote crystallity, reduce contact resistance, repair surface characteristics and promote adhesion where required. In particular, the dielectric surface in the channel region may be provided with a monolayer comprising a binding region and an organic region to improve device performance, e.g. by improving the organic semiconductor's morphology (in particular polymer alignment and crystallinity) and covering charge traps, in particular for a high k dielectric surface. Exemplary materials for such a monolayer include chloro- or alkoxy-silanes with long alkyl chains, e.g. octadecyltrichlorosilane.

OTFT Applications

OTFTs according to embodiments of the present invention have a wide range of possible applications. One such application is to drive pixels in an optical device, preferably an organic optical device. Examples of such optical devices include photoresponsive devices, in particular photodetectors, and light-emissive devices, in particular organic light emitting devices. OTFTs are particularly suited for use with active matrix organic light emitting devices, e.g. for use in display applications.

FIG. 5 illustrates an organic light-emitting device (OLED) pixel according to the invention. The OTFT comprises layers 2-14 described above. The OLED comprises anode 51, cathode 53 and an electroluminescent layer 52 provided between the anode and cathode. Further layers may be located between the anode and cathode, such as charge transporting, charge injecting or charge blocking layers. As with the OTFT, the active area of the OLED is defined by a well formed by patterning a layer of insulating photoresist 54. The OLED is constructed on a planarisation layer 55 (also known as a passivation layer) that is deposited over the OTFT. Exemplary materials for use in forming the passivation layer are BCBs and parylenes. The anode 51 of the OLED is electrically connected to the drain electrode of the organic thin film transistor by a conductive via 56 passing through passivation layer 55 and insulating layer 14.

It will be appreciated that pixel circuits comprising an OTFT and an optically active pixel area (e.g. light emitting or light sensing pixel area) may comprise further elements. In particular, the OLED pixel circuit of FIG. 5 will typically comprise least one further transistor in addition to the driving transistor shown, and at least one capacitor.

While this invention has been particularly shown and described with reference to preferred embodiments thereof, it will be understood by those skilled in the art that various changes in form and detail may be made therein without departing from the scope of the invention as defined by the appended claims.

The invention claimed is:

1. A method of forming an organic thin film transistor comprising:
   depositing source and drain material on a substrate; and
   forming a layer of insulating material over the source and drain material, the layer of insulating material being patterned to form a well;
   wherein the method comprises, once the well is formed, etching the source and drain material in the well to pattern source and drain electrodes;
   depositing organic semiconductive material in the well;
   depositing a dielectric material over the organic semiconductive material; and
   depositing a gate electrode over the dielectric material.

2. A method according to claim 1, comprising directly depositing the insulating material in patterned form.

3. A method according to claim 1, comprising depositing the insulating material in unpatterned form and subsequently patterning the insulating material.

4. A method according to claim 1, comprising after etching the source and drain material, exposing the insulating layer to an isotropic etch to thin the insulating layer and remove insulating layer material from an edge of the source and drain electrodes in the well.

5. A method according to claim 1, comprising forming a via in the layer of insulating material and depositing a resist material in the via prior to etching the source and drain material, subsequently removing the resist material after etching the source and drain material, and depositing conductive material in the via to form a contact via point.

6. A method according to claim 1, wherein the layer of insulating material comprises an organic material.

7. A method according to claim 6, wherein the layer of insulating material comprises a solution processable material.

8. A method according to claim 1, wherein the layer of insulating material comprises an organic photoresist.

9. A method according to claim 8, wherein the organic photoresist is a fluorinated organic photoresist.

10. A method according to claim 1, wherein the organic semiconductive material is solution processable.

11. A method according to claim 10, wherein the organic semiconductive material comprises a polymer or dendrimer.

12. A method according to claim 11, wherein the organic semiconductive material is conjugated.

13. A method according to claim 1, wherein the layer of organic semiconductive material comprises a dopant.

14. A method according to claim 1, wherein the dielectric material is organic.

15. A method according to claim 14, wherein the dielectric material is solution processable.

16. A method according to claim 14, wherein the dielectric material is the same as that used to form the insulating material.

* * * * *